(12) United States Patent
Wallace et al.

(10) Patent No.: US 8,043,722 B2
(45) Date of Patent: *Oct. 25, 2011

(54) OLIGOMERS AND POLYMERS

(75) Inventors: Paul Wallace, Hertfordshire (GB); Carl Towns, Essex (GB)

(73) Assignee: Merck Patent GmbH, Darmstadt (DE)

( * ) Notice: Subject to any disclaimer, the term of this patent is extended or adjusted under 35 U.S.C. 154(b) by 1117 days.

This patent is subject to a terminal disclaimer.

(21) Appl. No.: 10/582,459

(22) PCT Filed: Dec. 13, 2004

(86) PCT No.: PCT/EP2004/014152
§ 371 (c)(1),
(2), (4) Date: May 16, 2007

(87) PCT Pub. No.: WO2005/056638
PCT Pub. Date: Jun. 23, 2005

(65) Prior Publication Data
US 2008/0217605 A1    Sep. 11, 2008

(30) Foreign Application Priority Data
Dec. 13, 2003 (EP) ..................................... 03028789

(51) Int. Cl.
*H01L 51/54* (2006.01)
(52) U.S. Cl. ........... 428/690; 257/40; 528/401; 528/422
(58) Field of Classification Search .................. 428/690; 257/40; 528/401, 422
See application file for complete search history.

(56) References Cited

U.S. PATENT DOCUMENTS

| | | | | |
|---|---|---|---|---|
| 5,948,552 A | * | 9/1999 | Antoniadis et al. | 428/690 |
| 6,309,763 B1 | * | 10/2001 | Woo et al. | 428/690 |
| 6,740,900 B2 | * | 5/2004 | Hirai | 257/40 |
| 6,858,703 B2 | * | 2/2005 | Allen et al. | 430/73 |

FOREIGN PATENT DOCUMENTS

| | | | |
|---|---|---|---|
| EP | 0 805 143 | | 12/2001 |
| JP | 10-308280 A | | 11/1998 |
| WO | WO-99/32537 | | 7/1999 |
| WO | WO-00/55927 | | 9/2000 |
| WO | WO-01/66618 | | 9/2001 |
| WO | WO-03/000773 | | 1/2003 |
| WO | WO 03/000773 | * | 1/2003 |
| WO | WO 03/035714 | * | 5/2003 |

* cited by examiner

*Primary Examiner* — D. Lawrence Tarazano
*Assistant Examiner* — Gregory Clark
(74) *Attorney, Agent, or Firm* — Connolly Bove Lodge & Hutz LLP

(57) ABSTRACT

An optionally substituted oligomer or polymer comprising a repeat unit of formula (I); wherein each $Ar^1$ and $Ar^3$ is the same or different and independently represents an optionally substituted aryl or heteroaryl; n is at least 1; $Ar^2$ represents an optionally substituted aryl or heteroaryl comprising a linking ring to which the two nitrogen atoms are both directly linked; and at least one of $Ar^2$ and either or both of $Ar^1$ is substituted with at least one substituent.

(I)

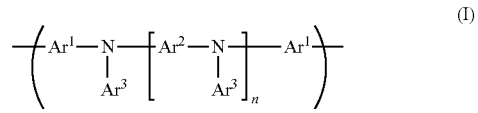

26 Claims, No Drawings

OLIGOMERS AND POLYMERS

RELATED APPLICATIONS

This application is a national stage application (under 35 U.S.C. 371) of PCT/EP2004/014152 filed Dec. 13, 2004, which claims benefit to European application 03028789.0 filed Dec. 13, 2003.

FIELD OF THE INVENTION

This invention relates to semiconductive oligomers and polymers, their synthesis and use as the active material in switching and opto-electrical devices.

BACKGROUND OF THE INVENTION

Organic semiconductors have attracted a great deal of interest due to their wide range of applications in opto-electrical and switching devices and their ease of processibility as compared to inorganic semiconductors. One class of opto-electrical devices is that using an organic material for light emission (an organic light emitting device or "OLED") or as the active component of a photocell or photodetector (a "photovoltaic" device). The basic structure of these devices is a semiconducting organic layer sandwiched between a cathode for injecting or accepting negative charge carriers (electrons) and an anode for injecting or accepting positive charge carriers (holes) into the organic layer.

In an organic electroluminescent device, electrons and holes are injected into a layer of electroluminescent semiconducting material where they combine to generate excitons that undergo radiative decay. Holes are injected from the anode into the highest occupied molecular orbital (HOMO) of the electroluminescent material; electrons are injected from the cathode into the lowest unoccupied molecular orbital (LUMO) of the electroluminescent material. An organic hole injecting material is commonly provided to assist injection of charge from the anode into the electroluminescent layer. In WO 90/13148 the organic light-emissive material is a conjugated polymer, namely poly(p-phenylenevinylene) ("PPV"). Other light emitting polymers known in the art include polyfluorenes and polyphenylenes. In U.S. Pat. No. 4,539,507 the organic light-emissive material is of the class known as small molecule materials, such as (8-hydroxyquinoline) aluminium ("Alq$_3$"). Light emitting polymers such as polyfluorenes and polyphenylenes are advantageous in that they are solution processable. In particular, solution processable light emitting polymers may be inkjet printed as described in EP 0880303 to produce high information content displays, in particular full colour displays.

The preferred approach in forming full colour OLEDs requires red, green and blue electroluminescent materials. However, a drawback of many blue organic electroluminescent materials is that their emission is a relatively pale blue, due to an insufficiently large HOMO-LUMO bandgap, when compared to the standard blue as defined by 1931 CIE coordinates.

Hole transporting co-polymers containing triarylamine "TA" and bis(triarylamine) units "BTA" are disclosed in, for example, WO 99/48160 and WO 03/000773. Examples of these units are shown below:

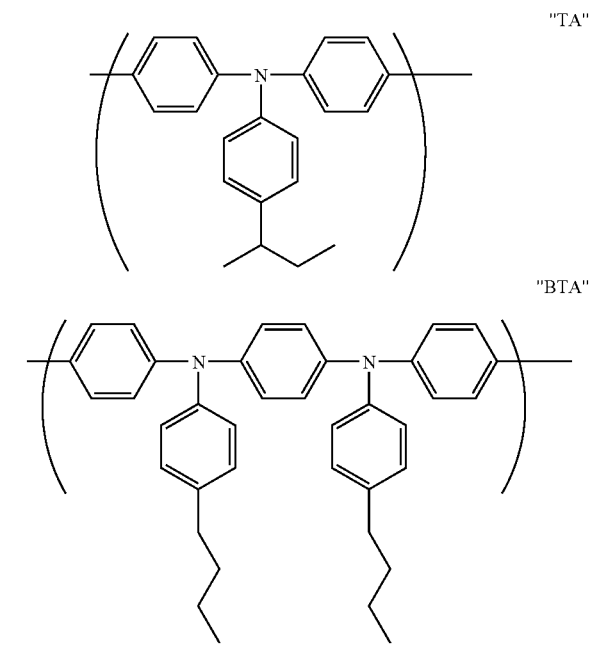

These materials may be used as hole transporting materials and/or as blue electroluminescent materials. However, the above identified co-polymers have drawbacks. In particular, the HOMO levels of these materials are not ideally matched to the workfunction of the typical anode and/or organic hole injecting material, which negatively affects their hole transporting properties. Furthermore, the blue emission from these materials is a relatively pale blue.

There therefore exists a need for polymers having good hole transporting properties and a deeper blue colour.

EP 1304750 discloses a polymer of formula (A):

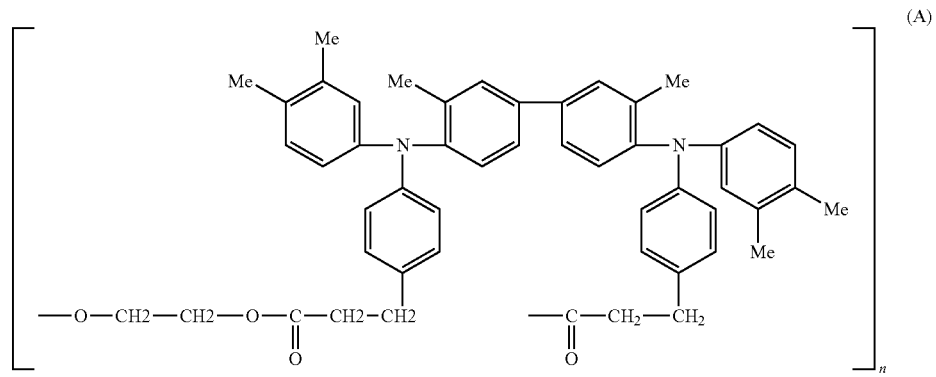

No significance is attached to the presence of the methyl substituents.

Likewise, Polymer Preprints (American Chemical Society, Division of Polymer Chemistry) (1997), 38(1), 396-397 discloses a hole transporting polymer of formula (B):

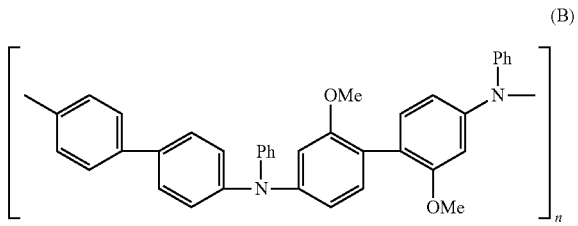

(B)

However, the present inventors have found that repeat units such as A and B which have a biphenylene unit between the two nitrogen atoms are not as effective as hole transporters when compared to such a unit with a phenylene unit between the two nitrogen atoms.

U.S. Pat. No. 6,309,763 discloses polymers containing BTA units which can be substituted on the pendant phenyl ring, but are unsubstituted on the phenyl rings which are incorporated in the main chain of the polymer.

WO 00/55927 discloses polymers which can also contain BTA units. However, the substitution of these units is only disclosed on the pendant aryl ring.

WO 99/32537 discloses substituted and unsubstituted triarylamines. However, these are defined low molecular weight compounds for use in organic electroluminescent devices based on small molecules. Corresponding polymers are not disclosed.

WO 99/32537 discloses polymers based on substituted and unsubstituted triarylamines. However, bis(triarylamine) units (BTA) are not disclosed in this application.

SUMMARY OF THE INVENTION

The present inventors have surprisingly found that "BTA"-type repeat units that are provided with a substituent on one or more of the aryl rings of the repeat unit located in the polymer backbone are significantly bluer than the unsubstituted units disclosed in the prior art.

Accordingly, in a first aspect the invention provides an optionally substituted oligomer or polymer comprising a repeat unit of formula (I):

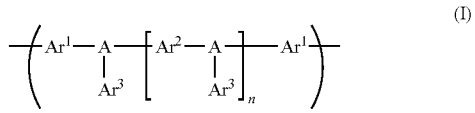

(I)

wherein n is at least 1; each A is a nitrogen atom or optionally substituted phosphorus atom; $Ar^1$ is the same or different and independently represents an optionally substituted arylene or heteroarylene; $Ar^3$ is the same or different and independently represents an optionally substituted aryl or heteroaryl; $Ar^2$ represents an optionally substituted arylene or heteroarylene comprising a linking ring to which the two atoms A are both directly linked; and at least one of $Ar^2$ and/or either or both of $Ar^1$ is substituted with at least one substituent.

Each A may be nitrogen, trivalent phosphorus or pentavalent phosphorus (e.g. phosphorus oxide). Preferably, each A is nitrogen or phosphorus. More preferably, each A is nitrogen.

Preferably, n is 1, 2 or 3. More preferably, n is 1. If n is 2 or 3, the substituents on $Ar^2$ are preferably selected from $C_{1-20}$ alkyl, $C_{1-20}$ perfluoroalkyl and fluorine.

In one preferred embodiment, only $Ar^2$ is substituted.

Preferably, the substituent is selected from the group consisting of optionally substituted, linear or branched, aliphatic or alicyclic $C_{1-20}$ alkyl; $C_{1-20}$ fluoroalkyl; $C_{1-20}$ alkoxy; halogen, preferably fluorine; nitro; cyano; sulfone and sulfoxide. Particularly preferred substituents are $C_{1-20}$ alkyl; $C_{1-20}$ perfluoroalkyl and fluorine.

Preferably, $Ar^2$ carries one or two substituents only.

In one preferred embodiment $Ar^2$ does not include 2,2'-methoxy-4,4'-biphenylene units.

Preferably, each $Ar^1$ and each $Ar^2$ are arylene. More preferably, each $Ar^1$ and $Ar^2$ are phenylene.

In one preferred embodiment, $Ar^3$ is optionally substituted phenyl. In another preferred embodiment, $Ar^3$ is a nitrogen-containing heteroaryl, preferably optionally substituted 4-pyridyl. In another preferred embodiment, $Ar^3$ is a sulfur-containing heteroaryl, preferably optionally substituted 2-thienyl.

Preferably, the oligomer or polymer comprises a second repeat unit. More preferably, the second repeat unit is conjugated to the first repeat unit. Most preferably, the second repeat unit is directly bound to and conjugated with the first repeat unit. Preferably, the second repeat unit is selected from optionally substituted phenyl, fluorene, spirobifluorene, indenofluorene, heteroaryl, dihydrophenanthrene or triarylamine.

Further repeat units may be present in addition to the repeat unit according to the invention and the second repeat unit.

The electronic or physical properties of the oligomers or polymers according to the invention (such as, respectively, electron affinity or solubility) may be modified by suitable substituents. Therefore, it is preferred that at least one $Ar^3$ is substituted by a substituent selected from the group consisting of optionally substituted, branched, cyclic or linear $C_{1-20}$ alkyl or $C_{1-20}$ alkoxy; $C_{1-20}$ fluoroalkyl and fluorine. Preferably, both $Ar^3$ groups are substituted, in which case it is preferred that the substituents are the same for ease of synthesis.

Substituents on $Ar^3$ provided for the purpose of modifying electron affinity and/or solubility are preferably located meta and/or para to atom A within the repeat unit backbone. Alternatively, substituents on $Ar^3$ may be provided for the purpose of steric interaction with the polymer backbone to create a twist along the polymer backbone, in which case the substituents are preferably located ortho to the atom A in order to maximise steric interaction with the polymer backbone. Particularly preferred substituents for such steric interaction are $C_{1-20}$ alkyl.

In a second aspect, the invention provides a blend comprising an oligomer or polymer according to the first aspect of the invention and an organic compound capable of at least one of the functions of hole transport, electron transport and emission. Preferably, the organic compound is capable of at least one function not provided by the oligomer or polymer according to the first aspect of the invention with which it is blended. The blend may comprise two or more components.

In a third aspect the invention provides an optionally substituted monomer of formula (II):

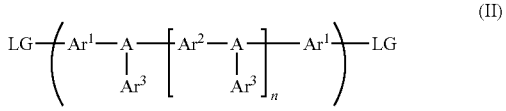

(II)

wherein Ar$^1$, Ar$^2$ and Ar$^3$, A and n are as described with respect to the first aspect of the invention and each LG is the same or different and represents a leaving group capable of participating in a polycondensation mediated by a metal of variable oxidation state.

Preferably, each LG is the same or different and represents a leaving group capable of participating in a polycondensation reaction, more preferably a metal insertion reaction with a nickel or palladium complex catalyst.

Preferably, each LG is the same or different and is independently selected from halogen; a reactive boronic group selected from a boronic acid group, a boronic ester group and a borane group; or a moiety of formula —O—SO$_2$—Z wherein Z is selected from the group consisting of optionally substituted alkyl and aryl.

In a fourth aspect the invention provides a method of forming an oligomer or polymer comprising the step of oligomerising or polymerising a monomer according to the third aspect, wherein said oligomerisation or polymerisation is mediated by a metal of variable oxidation state.

In a first preferred embodiment of the fourth aspect, each LG is independently a halogen or a moiety of formula —O—SO$_2$—Z, and the monomer of formula (II) is oligomerised or polymerised in the presence of a nickel complex catalyst.

In a second preferred embodiment of the fourth aspect, the monomer of formula (II) is oligomerised or polymerised with a second aromatic monomer in the presence of a palladium complex catalyst and a base and
a. each LG is the same or different and comprises a reactive boronic group and the second monomer comprises two reactive groups independently selected from halogen and a moiety of formula —O—SO$_2$—Z, or
b. each LG independently comprises a halogen or a moiety of formula —O—SO$_2$—Z and the second monomer comprises two reactive boron groups which are the same or different.

In a third preferred embodiment of the fourth aspect, one LG is a reactive boron group; the other LG is a halogen or a moiety of formula —O—SO$_2$—Z; and the monomer of formula (II) is oligomerised or polymerised in the presence of a palladium complex catalyst and a base.

In a fifth aspect, the invention provides an optical device comprising an oligomer or polymer according to the first aspect of the invention. The oligomer or polymer may be provided in the form of a blend according to the second aspect of the invention.

Preferably, the oligomer or polymer is located in a layer between a first electrode for injection of holes and a second electrode for injection of electrons.

Preferably, the optical device is an electroluminescent device, i.e. a device that produces electroluminescence when a forward bias is applied across the electrodes. The polymer or oligomer according to the invention may itself be the source of the electroluminescence. Alternatively, it may function as a charge transporting or charge injecting material for transporting or injecting holes and/or electrons to another organic material performing the function of electroluminescence. The optical device may also be a photovoltaic device.

In a sixth aspect, the invention provides a switching device comprising an oligomer or polymer according to the first aspect of the invention. The oligomer or polymer may be provided in the form of a blend according to the second aspect of the invention.

Preferably, the switching device is a field effect transistor comprising an insulator having a first side and a second side; a gate electrode located on the first side of the insulator; an oligomer or polymer according to the first aspect of the invention located on the second side of the insulator; and a drain electrode and a source electrode located on the oligomer or polymer.

In a seventh aspect, the invention provides an integrated circuit comprising a field effect transistor according to the sixth aspect of the invention.

DETAILED DESCRIPTION OF THE INVENTION

The invention is described hereinafter with reference to polymers and polymerisation, however it will be appreciated that this description applies equally to corresponding oligomers and oligomerisation.

Polymers according to the invention may be used as active materials in any of the aforementioned optical devices, in particular electroluminescent devices and photovoltaic devices (i.e. photodetectors or photocells) or in switching devices such as field effect transistors.

When used in OLEDs, polymers according to the invention may be used as solution processable, electron transporting, hole transporting and/or emissive materials in organic light emitting devices.

The effect of the introduced substituents can be both, steric and electronic. For example, electron withdrawing substituents which cause twisting of the polymer chain, such as fluoroalkyl chains, will result in a strong blue shift of the emission colour. In contrast to this, electron donating substituents which cause twisting of the polymer chain, such as alkoxy groups, will result in less blue shift and retain good charge transporting properties. Examples of repeat units according to the invention include the following (a) Alkyl-substituted Repeat Units The present inventors have found that alkyl substituted repeat units have a bluer colour of emission than the corresponding unsubstituted repeat units. Without wishing to be bound by any theory, the colour shift is believed to be due primarily to steric interactions between the alkyl substituent and the backbone causing a twist within the polymer backbone. This twist reduces the degree of conjugation and the delocalisation between the π-electron systems within the polymer, resulting in an increase in HOMO-LUMO bandgap. This may result in worse hole transporting properties of the polymer. However, surprisingly it was found that the quantum efficiency of the polymer is comparable or better than in a corresponding polymer with less twist in the polymer chain. Without wishing to be bound by theory, we propose that in polymers according to the state of the art, the charge balance is not optimal and by twisting the polymer a change in charge transport properties results in improved charge balance and therefore better emission efficiency. This twist may be amplified by providing one or more substituents, in particular alkyl substituents on one or more of the pendant aryl groups. If a substituent is provided on a pendant aryl group for the purpose of increasing the degree of twisting within the repeat unit then it is preferably located in the ortho position to maximise steric interaction with the polymer backbone. Examples of alkyl substituted repeat units according to the invention include the following:

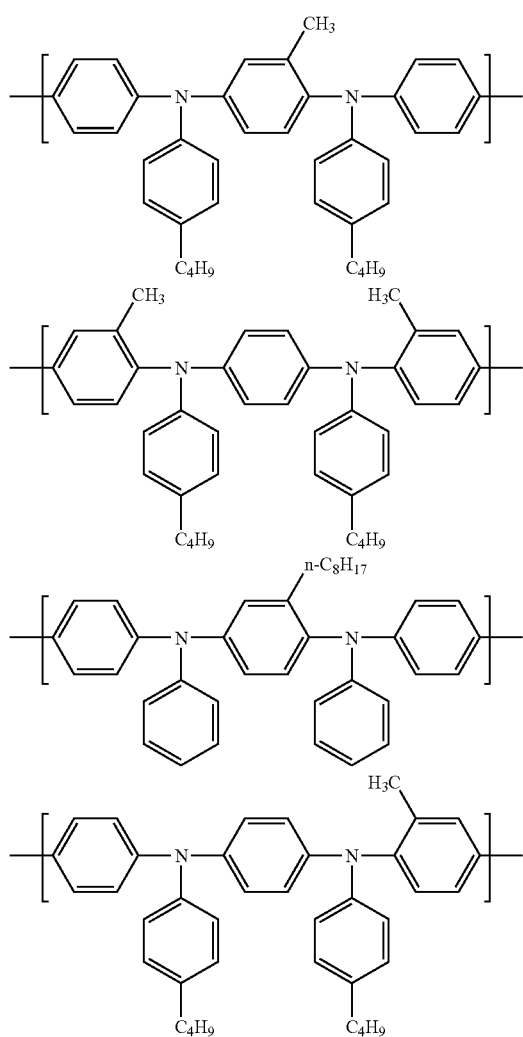

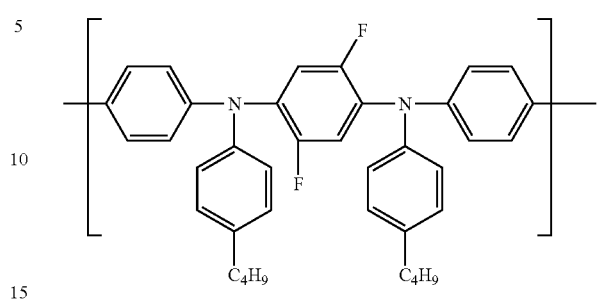

that may be caused by steric hindrance for larger substituents. An example of such a repeat unit is as follows:

(b) Fluoroalkyl-substituted Repeat Units

Fluoroalkyl substituted repeat units offer about the same steric effect as alkyl substituted repeat units. In addition, the highly electronegative nature of these substituents results in a colour of emission that is even bluer than that observed for corresponding alkyl substituted repeat units. The blue-shifting effect is most pronounced for perfluoroalkyl-substituted repeat units, in particular trifluoromethyl.

Examples of fluoroalkyl-substituted repeat units according to the invention are the same as those shown above with alkyl substituents, except that alkyl substituents on phenyl groups in the repeat unit backbone are replaced by corresponding perfluoroalkyl substituents.

(c) Fluorinated Repeat Units

Fluorine substituents withdraw electron density as per fluoroalkyl substituents, but without any steric effects. The absence of a twist in the backbone of fluorine-substituted repeat units provides conduction that is comparable to that of a corresponding unsubstituted repeat unit.

Examples of fluorine-substituted repeat units according to the invention are the same as those shown above with alkyl substituents, except that alkyl substituents on phenyl groups in the repeat unit backbone are replaced by fluorine atoms. Furthermore, the small size of fluorine atoms allows more substituents to be located on a given ring without difficulties The repeat units of the invention have a single central ring that links the two nitrogen atoms of the repeat unit, as opposed to the prior art repeat units described above that comprise a central biphenyl unit. The present inventors have found that linking the two nitrogens of a diamine repeat unit with a single aromatic ring, such as phenyl, is preferable to linking with a biphenyl. Without wishing to be bound by any theory, it is believed that the advantages of the inventive repeat units as compared to prior art repeat units are due to the reduced conjugation across a single ring as compared to prior art systems comprising a central biphenyl unit.

The polymers may be prepared by Suzuki polymerisation as described in, for example, WO 00/53656 or WO 03/048225 and Yamamoto polymerisation as described in, for example, T. Yamamoto, "Electrically Conducting And Thermally Stable π-Conjugated Polyarylenes Prepared by Organometallic Processes", Progress in Polymer Science 1993, 17, 1153-1205 or in WO 04/022626. For example, in the synthesis of a linear polymer by Yamamoto polymerisation, a monomer having two reactive halide or sulfonate groups is used. Similarly, according to the method of Suzuki polymerisation, at least one reactive group is a reactive boron group.

Suzuki polymerisation employs a Pd(0) complex or a Pd(II) salt. Preferred Pd(0) complexes are those bearing at least one phosphine ligand such as $Pd(Ph_3P)_4$. Another preferred phosphine ligand is tris(ortho-tolyl)phosphine, i.e. $Pd[(o-Tol)_3P]_4$. Preferred Pd (II) salts include palladium acetate, i.e. $Pd(OAc)_2$. Suzuki polymerisation is performed in the presence of a base, for example sodium carbonate, potassium phosphate or an organic base such as tetraethylammonium carbonate.

Yamamoto polymerisation employs a Ni(0) complex, for example bis(1,5-cyclooctadienyl)nickel (0).

Suzuki polymerisation may be used to prepare regioregular, block and random copolymers from aromatic monomers with two leaving groups LG. The synthesis of polymers with blocky structures is described in detail in, for example, DE 103 37 077.3. In particular, homopolymers or random copolymers may be prepared when one leaving group LG is a halogen and the other leaving group LG is a reactive boron group. Alternatively, block or regioregular, in particular AB, copolymers may be prepared when both leaving groups of a first monomer are boron and both leaving groups of a second monomer are halide.

The monomer according to the invention may be polymerised alone to form a homopolymer or in the presence of one or more co-monomers to form a co-polymer. Possible co-repeat units derived from such co-monomers are outlined below; it will be appreciated that each of these co-repeat units may be derived from a comonomer comprising two polymerisable groups independently selected from halogen (preferably chlorine, bromine or iodine, more preferably bromine), a boronic acid group, a boronic ester group and a borane group.

As alternatives to halogens as described above, leaving groups of formula —O—SO$_2$Z can be used wherein Z is as defined above. Particular examples of such leaving groups are tosylate, mesylate and triflate.

Where the polymer according to the invention is a copolymer, it may possess the repeat unit of the invention with one or more different co-repeat units. One class of co-repeat units is arylene repeat units, in particular: 1,4-phenylene repeat units as disclosed in J. Appl. Phys. 1996, 79, 934; fluorene repeat units as disclosed in EP 0842208, trans-indenofluorene repeat units as disclosed in, for example, Macromolecules 2000, 33(6), 2016-2020 and WO 04/041901; cis-indenofluorene repeat units as described in EP 03014042.0; spirobifluorene repeat units as disclosed in, for example EP 0707020; dihydrophenanthrene repeat units as disclosed in DE 103 37 346.2 and stilbene repeat units (commonly known as "OPV" repeat units) as disclosed in WO 03/020790. Each of these repeat units is optionally substituted. Examples of substituents include solubilising groups such as C$_{1-20}$ alkyl or alkoxy; electron withdrawing groups such as fluorine, nitro or cyano; and substituents for increasing glass transition temperature (Tg) of the polymer such as bulky groups, e.g. tert-butyl or optionally substituted aryl groups.

A further class of preferred co-repeat units are repeat units comprising one or two amino groups in the repeat unit backbone such as co-repeat units comprising triarylamine groups, in particular repeat units of formulae 1-3:

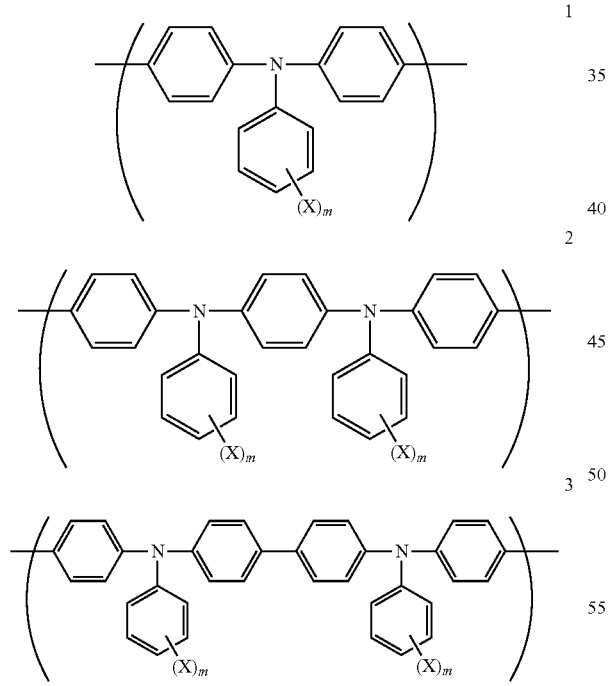

wherein X in each occurrence is independently hydrogen or a substituent and m is 1, 2 or 3. Preferably at least one X is independently selected from the group consisting of alkyl, aryl, perfluoroalkyl, thioalkyl, cyano, alkoxy, heteroaryl, alkylaryl and arylalkyl groups. Particularly preferred groups X are n-alkyl (in particular n-butyl), branched alkyl (in particular s-butyl and t-butyl), a n-alkoxy or a trifluoroalkyl (in particular trifluoromethyl) group because they are suitable for helping to select the HOMO level and/or for improving solubility of the polymer. Preferably, m is 1 or 2, more preferably 1. Preferably, where X is a substituent it is located in the meta- or para-position, most preferably in the para-position.

Use of trifluoromethyl groups in repeat units of this type is disclosed in WO 01/66618.

A yet further class of co-repeat units include heteroaryl repeat units such as optionally substituted 2,5-thienyl, pyridyl, diazine, triazine, azole, diazole, triazole, oxazole or oxadiazole; or optionally substituted units of formulae 4-11:

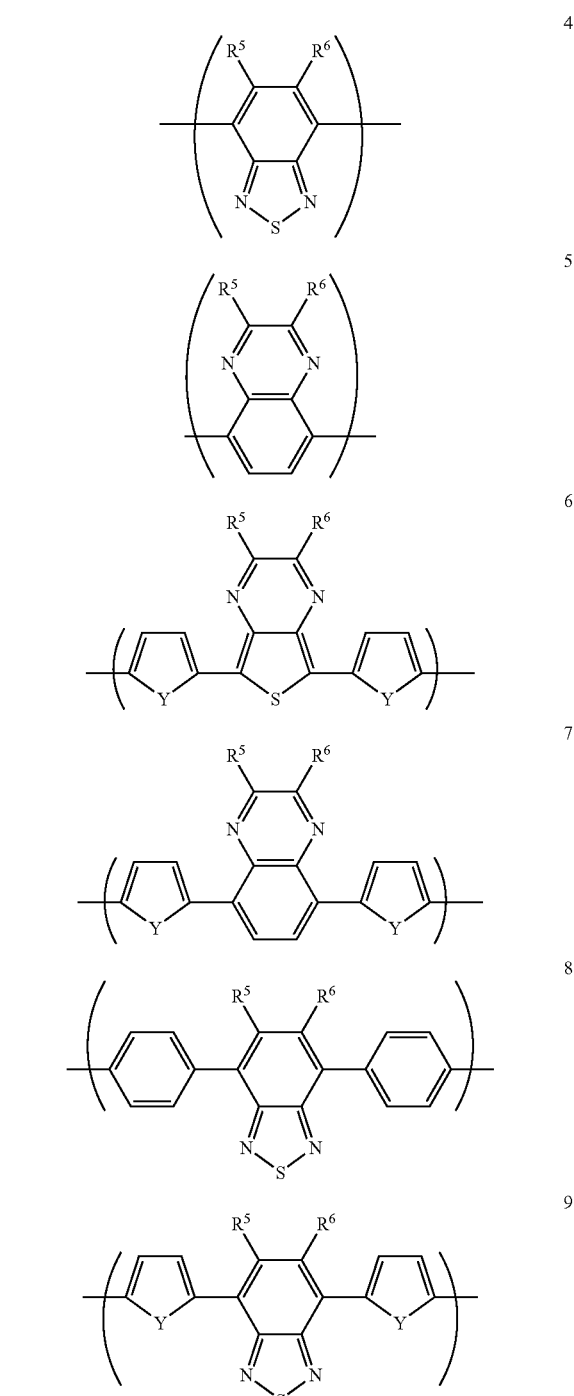

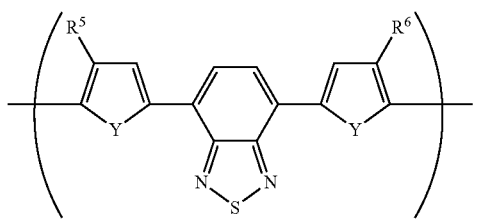

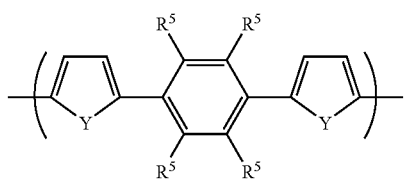

wherein each Y represents sulfur or oxygen, preferably sulfur; and $R^5$ and $R^6$ are the same or different and are each independently hydrogen or a substituent group. Preferably, one or more of $R^5$ or $R^6$ may be selected from hydrogen, alkyl, aryl, perfluoroalkyl, thioalkyl, cyano, alkoxy, heteroaryl, alkylaryl, or arylalkyl. Most preferably, $R^5$ and $R^6$ are independently hydrogen, alkyl or phenyl. Preferably, for practical reasons, $R^5$ and $R^6$ are the same when both are a substituent.

When used in an OLED, polymers according to the invention possess at least one of hole transporting, electron transporting and emissive properties. Where the polymer has more than one of these properties, different properties may be provided by different monomer repeat units or segments of a block co-polymer, in particular segments of the polymer backbone as described in WO 00/55927 or pendant groups as described in WO 02/26859. Alternatively, if the polymer of the invention has only one or two of the properties of hole transport, electron transport and emission, it may be blended with one or more further polymers, oligomers or low molecular weight compounds having the remaining required property or properties as described in WO 99/48160.

Optical devices tend to be sensitive to moisture and oxygen. Accordingly, the substrate of the device preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

Although not essential, the presence of a layer of organic hole injection material over the anode is desirable as it assists hole injection from the anode into the layer or layers of semiconducting polymer. Examples of organic hole injection materials include PEDT/PSS as disclosed in EP 0901176 and EP 0947123, or polyaniline as disclosed in U.S. Pat. Nos. 5,723,873 and 5,798,170.

The cathode is selected in order that electrons are efficiently injected into the device and as such may comprise a single conductive material such as a layer of aluminium. Alternatively, it may comprise a plurality of metals, for example a bilayer of calcium and aluminium as disclosed in WO 98/10621, or a thin layer of dielectric material such as lithium fluoride to assist electron injection as disclosed in, for example, WO 00/48258.

The device is preferably encapsulated with an encapsulant to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142.

In a practical optoelectronic device, at least one of the electrodes is semi-transparent in order that light may be absorbed (in the case of a photoresponsive device) or emitted (in the case of a PLED). Where the anode is transparent, it typically comprises indium tin oxide. Examples of transparent cathodes are disclosed in, for example, GB 2348316. Where the polymer of the invention is used in a switching device such as a field effect transistor, it will be appreciated that all of the electrodes may be opaque.

The PLED may be a static image device, i.e. a device that displays only a single image. In the simplest case, the device comprises an anode, cathode and electroluminescent polymer, each of which are unpatterned. Such a device may be suitable for lighting applications or signs displaying a fixed image. Alternatively, the device may be a variable image device, i.e. a device wherein different areas of the electroluminescent layer may be independently addressed. Such a device may be a segmented, passive matrix or active matrix device.

The polymer may be deposited by any one of a range of techniques such as spin-coating, dip-coating, inkjet printing as disclosed in EP 0880303, laser transfer as described in EP 0851714, flexographic printing, screen printing and doctor blade coating. If the technique requires deposition of the polymer from solution, then any one of a range of organic solvents may be used including, for example, alkyl-aromatics, in particular mono- or poly-alkylbenzenes such as toluene, xylene and durene.

EXAMPLES

Example 1

Monomer 1: Alkyl-substituted Repeat Unit (Substituents on $Ar^1$ in Formula I)

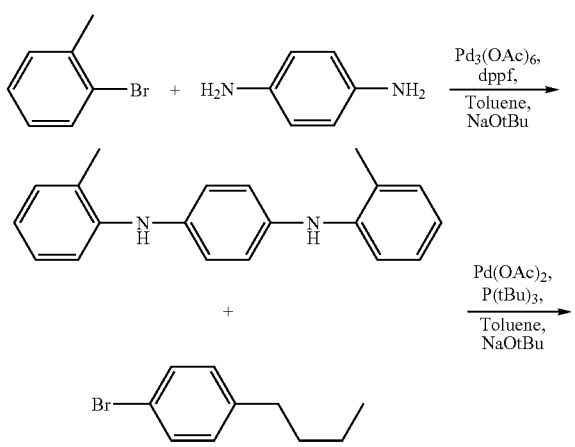

-continued

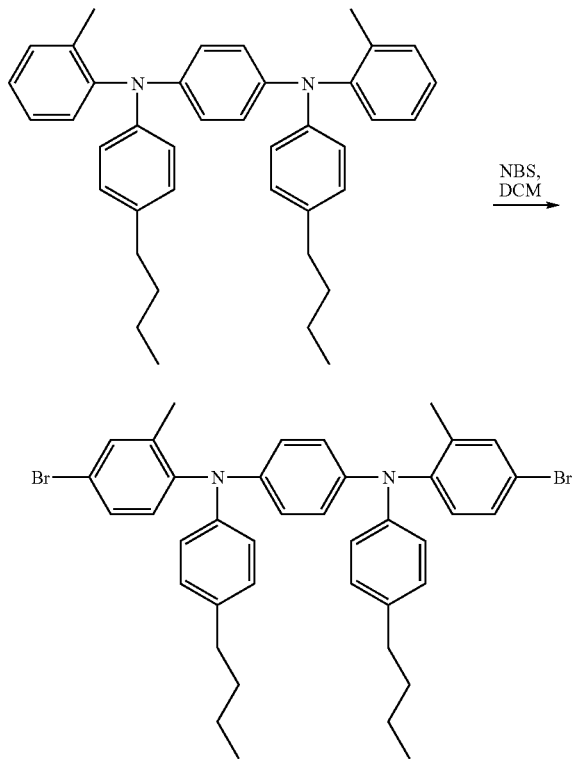

1.1 Preparation of
N,N'-Di-(o-tolyl)-1,4-phenylenediamine

To a 5 L round-bottomed 3-neck flask, equipped with reflux condenser, nitrogen inlet and exhaust, mechanical stirrer (equipped with PTFE stirrer rod, guide and stirrer blade) and a powder addition funnel, was added the 1,4-phenylenediamine (77.85 g, 0.720 mol, 1.0 eq.) and 2-bromotoluene (270.87 g, 1.584 mol, 2.2 eq.) and toluene (1500 mL). The resulting mixture was stirred for 10 mins, then degassed by sparging with nitrogen gas for 1 hour. The palladium(II) acetate (3.60 g, 0.1 eq.) and 1,1'-diphenylphosphinoferrocene (dppf) (8.88 g, 0.1 eq.) were then added and the mixture stirred under nitrogen for 15 mins. Sodium tert-butoxide (207.36 g, 2.16 mol, 3.0 eq.) was then charged as a solid. The mixture was heated to reflux and maintained at this temperature for 16 hours. GCMS after this time indicated complete reaction.

The mixture was allowed to cool to room temperature and poured into a mixture of ice-water (1000 mL) and diethyl ether (500 mL). The phases were separated and the organic phase passed through celite (200 g). The filtrates were concentrated to dryness in vacuo and the crude product triturated from methanol. The product was recovered by filtration and the cake washed with methanol (2×250 mL). The solid product was then dried for 24 hours at 40° C. in vacuo.

The product was afforded as a pale white solid, 132.17 g, 65%. NMR and GCMS data are consistent with the required structure.

1.2 Preparation of N,N'-Bis-(4-n-butylphenyl)-N,N'-di-(o-tolyl)-1,4-phenylenediamine Procedure as described above except using the product from above (44.0 g, 0.152 mol, 1.0 eq.), 1-bromo-4-butylbenzene (76.4 g, 0.382 mol, 2.5 eq.), palladium(II) acetate (3.03 g, 0.1 eq.), tri-tert-butylphosphine (5.0 g, 0.2 eq.), toluene (1000 mL) and sodium tert-butoxide (45.14 g, 0.456 mol, 3.0 eq.).

The product was afforded as a pale white solid, 72.12 g, 62%. NMR and GCMS data are consistent with the required structure.

1.3 Preparation of N,N'-Bis-(4-n-butylphenyl)-N,N'-di-(4-bromo-2-methylphenyl)-1,4-phenylenediamine To a 1 L, 3-neck round-bottomed flask equipped with mechanical stirrer, low temperature thermometer, powder addition funnel and nitrogen inlet/exhaust, was added the product from the reaction above, N,N'-bis-(4-n-butylphenyl)-N,N'-di-(o-tolyl)-1,4-phenylenediamine (55.28 g, 0.1 mol, 1.0 eq.) and dichloromethane (500 mL). The solution was cooled to −5° C. and N-bromosuccinimide (35.60 g, 0.2 mol, 2.0 eq.) added portionwise, maintaining the internal temperature below 0° C. The reaction was allowed to warm to room temperature overnight (16 hours).

The solvent was removed in vacuo and the residue suspended in toluene (300 mL). The suspension was filtered through a porosity 3 sinter funnel and the filtrates concentrated to dryness in vacuo. The residue was purified by repeated recrystallisation from isopropyl alcohol.

Example 2

Monomer 2: Fluorine-substituted Repeat Unit

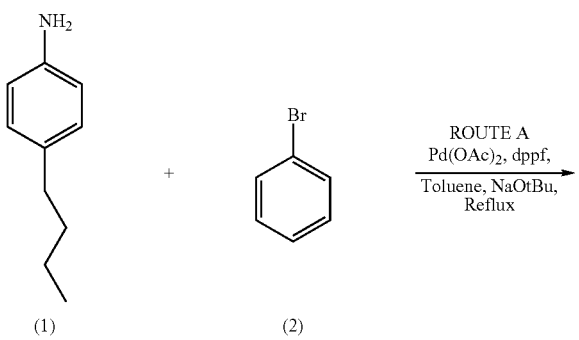

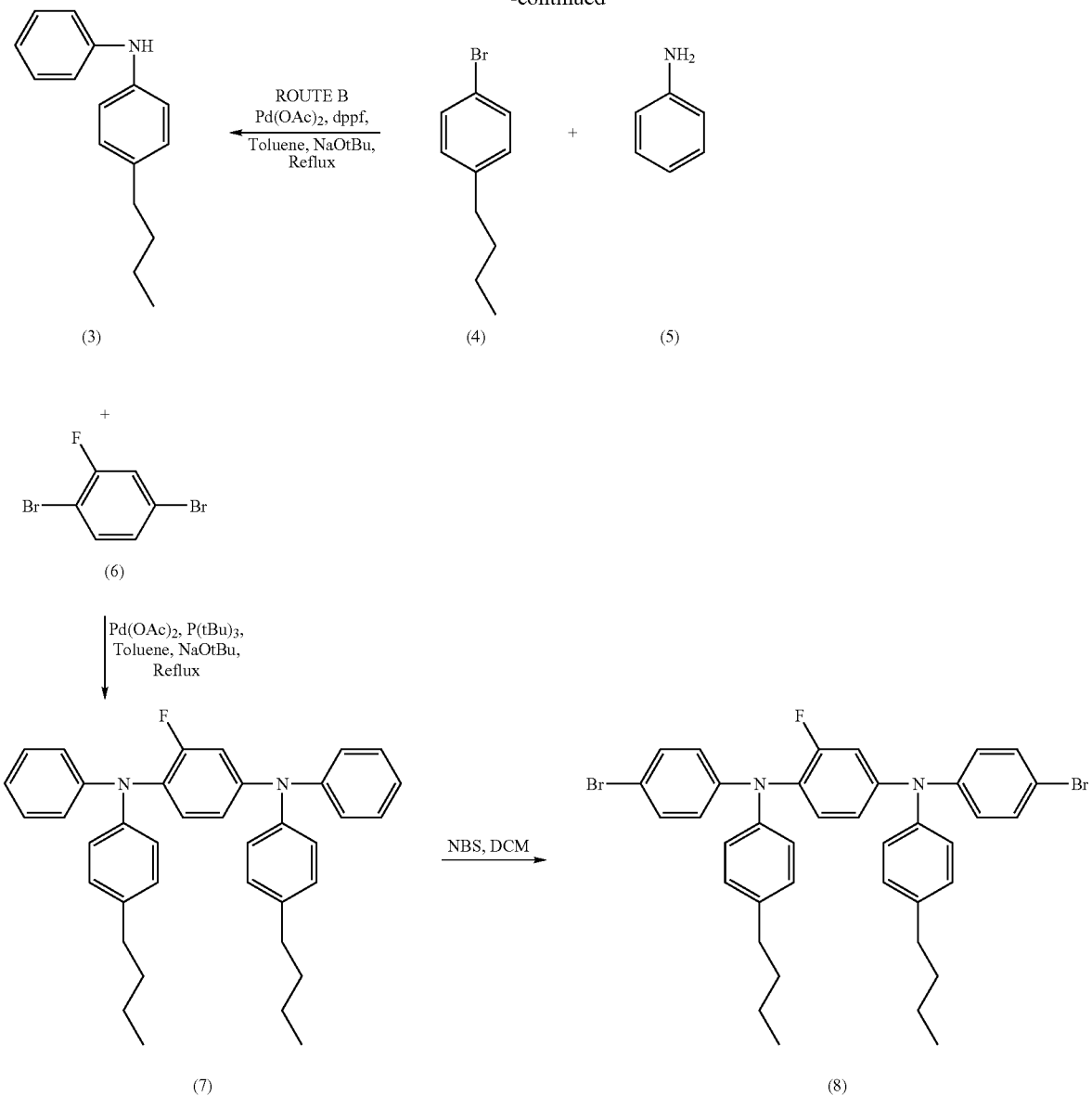

2.1 N-Phenyl-N-(4-n-butylphenyl)amine (3)—Route A

To a 5000 mL 3-neck, round-bottomed flask, equipped with overhead stirrer, nitrogen inlet/exhaust, internal thermometer and reflux condenser, were added toluene (3000 mL) 1-bromo-4-(n-butyl)benzene (4) (161.04 g, 0.756 mol, 1.0 eq.) and aniline (5) (70.41 g, 0.756 mol, 1.0 eq). The resulting solution was degassed by sparging for 30 mins with nitrogen gas, then palladium(II) acetate (2.5 g, 0.011 mol, 1.5 mol %) and 1,1'-diphenylphosphinoferrocene (dppf, 5.0 g, 0.011 mol, 1.5 mol %) were added and the resulting solution stirred for 15 mins under nitrogen. The base, sodium tert-butoxide (109 g, 1.14 mol, 1.5 eq.) was then added and the resulting suspension heated to reflux for 24 hours. After this time, GC-MS indicated complete reaction.

The solution was allowed to cool to room temperature and added to deionised water (1500 mL). The bi-phasic mixture was stirred vigorously for 10 mins and the toluene phase removed. The aqueous was extracted with a further portion of toluene (1000 mL). The toluene phases were combined and passed through silica gel (100 g), then the combined filtrates concentrated to dryness in vacuo. The resulting oil (3) was purified by distillation at 3 mbar pressure, boiling point 120-130° C. (bath 180° C.).

Yield: 136 g, 81%. GC-MS showed purity at >99.5%, m/z 225 (retention time Rt: 9.69 mins).

2.2 N-Phenyl-N-(n-butylphenyl)amine (3)—Route B

Procedure as described above, only using 4-butylaniline (1) (74.1 mL, 0.4692 mol, 1.0 eq.), bromobenzene (2) (49.42 mL, 0.4692 mol, 1.0 eq.), palladium(II) acetate (1.0 g, 0.0045 mol, 1 mol %), dppf (2.472 g, 0.0045 mol, 1 mol %), sodium tert-butoxide (90.2 g, 0.9384 mol, 2.0 eq.) and toluene (400 mL).

The products were purified by column chromatography to afford two main fractions—fraction A, 60.46 g, 68.5% pure by GC-MS; fraction B, 78.67 g, 100% pure by GC-MS (Rt 9.69 mins).

Pure yield (fraction B): 78.67 g, 75%.

2.3 N,N'-Diphenyl-N,N'-bis-(4-n-butylphenyl)-2-fluorophenylene-1,4-diamine (7)

Procedure as described above, only using N-phenyl-N-(4-n-butylphenyl)amine (3) (88.61 g, 0.394 mol, 2.0 eq.), 1,4-dibromo-2-fluorobenzene (6) (50 g, 0.1946 mol, 1.0 eq.), palladium(II) acetate (0.873 g, 0.004 mol, 2 mol %), tri-tert-butylphosphine (2.362 g, 0.0117 mol, 6 mol %), sodium tert-butoxide (56.12 g, 0.584 mol, 3.0 eq.) and toluene (500 mL).

The crude product was purified by trituration from hot acetonitrile (300 mL) to afford 103.3 g of crude product. This was recrystallised twice from acetonitrile to afford 59 g of product with a HPLC purity of 96.13%. This was then recrystallised once more and clarified (hot filtration) to afford the desired product at a HPLC purity of 98.06% (19.07 g, 18%). A further 19 g (18%) was obtained from the liquors. GC-MS showed one peak at Rt 24.35 mins, m/z 542.

2.4 N,N'-Bis(4-Bromophenyl)-N,N'-bis-(4-n-butylphenyl)-2-fluorophenylene-1,4-diamine (8)

To a 500 mL round-bottomed flask, equipped with mechanical overhead stirrer, low temperature thermometer, nitrogen inlet/exhaust and bubbler was added the precursor compound (7) (19.07 g, 0.035 mol, 1.0 eq.) and dichloromethane (220 mL). The resulting solution was cooled to −5° C. and N-bromosuccinimide (12.53 g, 0.07 mol, 2.0 eq.) added portionwise so as to maintain the internal temperature at −5° C. The solution was stirred and slowly allowed to warm to room temperature over 16 hours. GC-MS after this time indicated complete conversion to the desired product.

The solvent was removed in vacuo and the residue resuspended in toluene, causing precipitation of the succinimide by-product, which was removed by filtration. Concentration of the filtrate in vacuo afforded the crude product. Purification by repeated recrystallisation from acetonitrile/toluene mixture afforded the product at 99.42% HPLC purity (5.92 g, 24%), with a further 11 g at 96.88% being recovered from the mother liquors. GC-MS: Rt 20.04 mins, m/z 700.

Example 3

Monomer 3: Trifluoromethyl-substituted Repeat Unit (Boronic Ester and Halide Monomers)

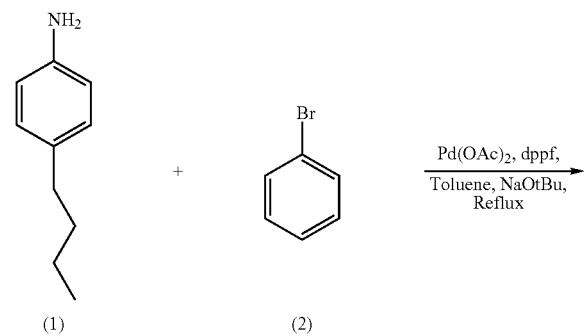

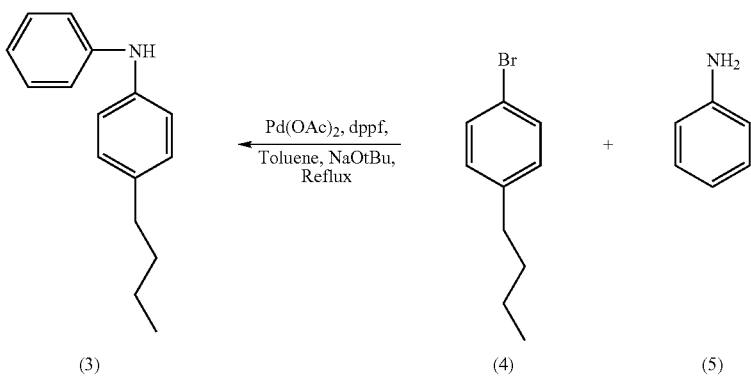

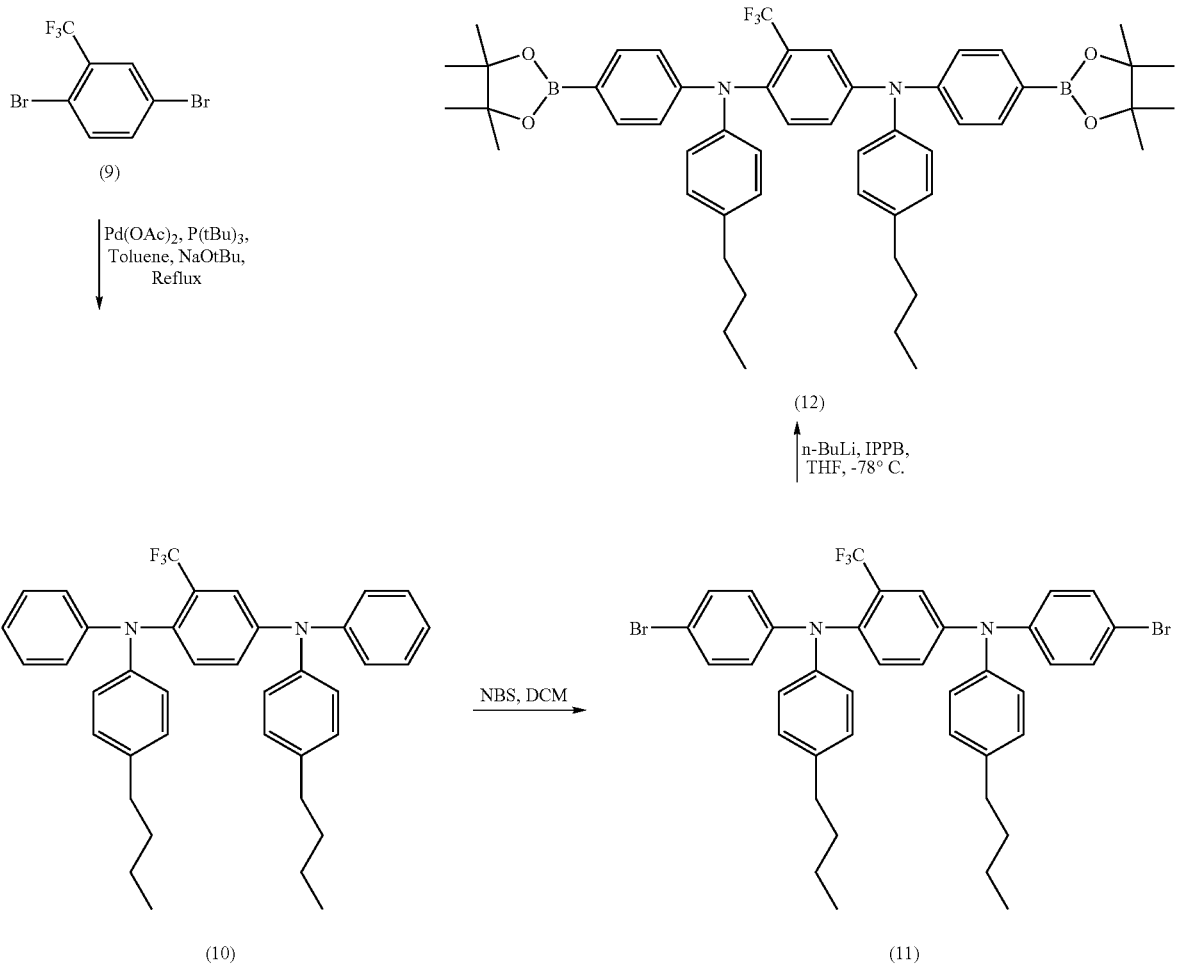

3.1 N,N'-Diphenyl-N,N'-bis-(4-n-butylphenyl)-2-(trifluoromethyl)phenylene-1,4-diamine (9)

Procedure as described above, only using N-phenyl-N-(n-butylphenyl)amine (3) (82.75 g, 0.348 mol, 2.0 eq.), 1,4-dibromo-2-(trifluoromethyl)benzene (9) (50 g, 0.1839 mol, 1.0 eq.), palladium(II) acetate (0.826 g, 0.0037 mol, 2 mol %), tri-tert-butylphosphine (2.362 g, 0.0110 mol, 6 mol %), sodium tert-butoxide (53.02 g, 0.538 mol, 3.0 eq.) and toluene (500 mL). After reflux for 16 hours, GC-MS indicated incomplete conversion, so a further charge of catalyst and ligand were added, followed by reflux for a further 20 hours. GC-MS after this time indicated almost complete reaction.

The reaction mixture was poured into deionised water (500 mL), but phase separation was poor. The mixture was filtered through celite to remove the palladium black and afforded more facile phase separation. The aqueous phase was extracted with dichloromethane (3×200 mL). The organic phases were combined with the toluene phase and concentrated to dryness in vacuo.

The crude product (10) was then purified by column chromatography (hexanes 100% to 5% diethyl ether in hexanes gradient) to afford the product as an oil (35.5 g, 33%) at a HPLC purity of 97.5%. GC-MS indicated one peak at 18.65 mins, m/z 592.

3.2 N,N'-Bis-(4-bromophenyl)-N,N'-bis-(4-n-butylphenyl)-2-(trifluoromethyl)phenylene-1,4-diamine (11)

To a 500 mL round-bottom flask, equipped with mechanical overhead stirrer, low temperature thermometer, nitrogen inlet/exhaust and bubbler was added the precursor compound (10) (35.5 g, 0.06 mol, 1.0 eq.) and dichloromethane (350 mL). The resulting solution was cooled to −5° C. and N-bromosuccinimide (21.35 g, 0.12 mol, 2.0 eq.) added portionwise so as to maintain the internal temperature at −5° C. The solution was stirred and slowly allowed to warm to room temperature over 16 hours. GC-MS after this time indicated complete conversion to the desired product.

The solvent was removed in vacuo and the residue resuspended in toluene, causing precipitation of the succinimide by-product, which was removed by filtration. Concentration of the filtrate in vacuo afforded the crude product. Purification was initially by trituration from aqueous isopropyl alcohol, then by trituration from acetonitrile. This afforded the main product (11) (6.17 g, 14%) as an oil at 99.62% GCMS purity, Rt 18.23 mins, m/z 750. 94.29% HPLC purity.

3.3 N,N'-Bis-(4-boronic pinacol ester phenyl)-N,N'-bis-(4-n-butylphenyl)-2-(trifluoromethyl)phenylene-1,4-diamine (12)

As the dibromide material (11) was not crystalline and therefore could not be purified to the required standard for polymerisation, then conversion to the bis(pinacol) boronate ester was performed.

To a 500 mL, 3-necked round-bottomed flask equipped with mechanical stirrer, pressure-equalising dropping funnel, low temperature internal thermometer and nitrogen inlet/exhaust was added the dibromide (11) (9.16 g, 12.2 mmol, 1.0 eq.) and anhydrous THF (100 mL). The resulting solution was stirred under nitrogen and cooled to −78° C. A solution of n-Butyllithium (2.5M in hexanes) (10.8 mL, 26.9 mmol, 2.2 eq.) was added dropwise so as to maintain the internal temperature below −65° C. The resulting solution was allowed to stir at −78° C. for 1 hour and then a solution of isopropylpinacolborate (5.9 g, 31.7 mmol, 2.6 eq.) in anhydrous THF (10 mL) was added dropwise, so as to maintain the internal temperature below −65° C. After addition, the solution was allowed to warm slowly to room temperature over 16 hours.

The mixture was re-cooled to 0° C. and a solution of HCl in anhydrous ether (2M, 18 mL, 36.6 mmol, 3.0 eq.) was added and the solution stirred for 1 hour whilst warming to room temperature. The solvents were then removed in vacuo and the residue re-suspended in toluene (100 mL) causing precipitation of LiBr which was removed by filtration. The filtrates were concentrated to dryness in vacuo and the product crystallised from IPA.

Yield: 5 g, 50%.

Example 4

Monomer 4: Difluoro-substituted Repeat Unit

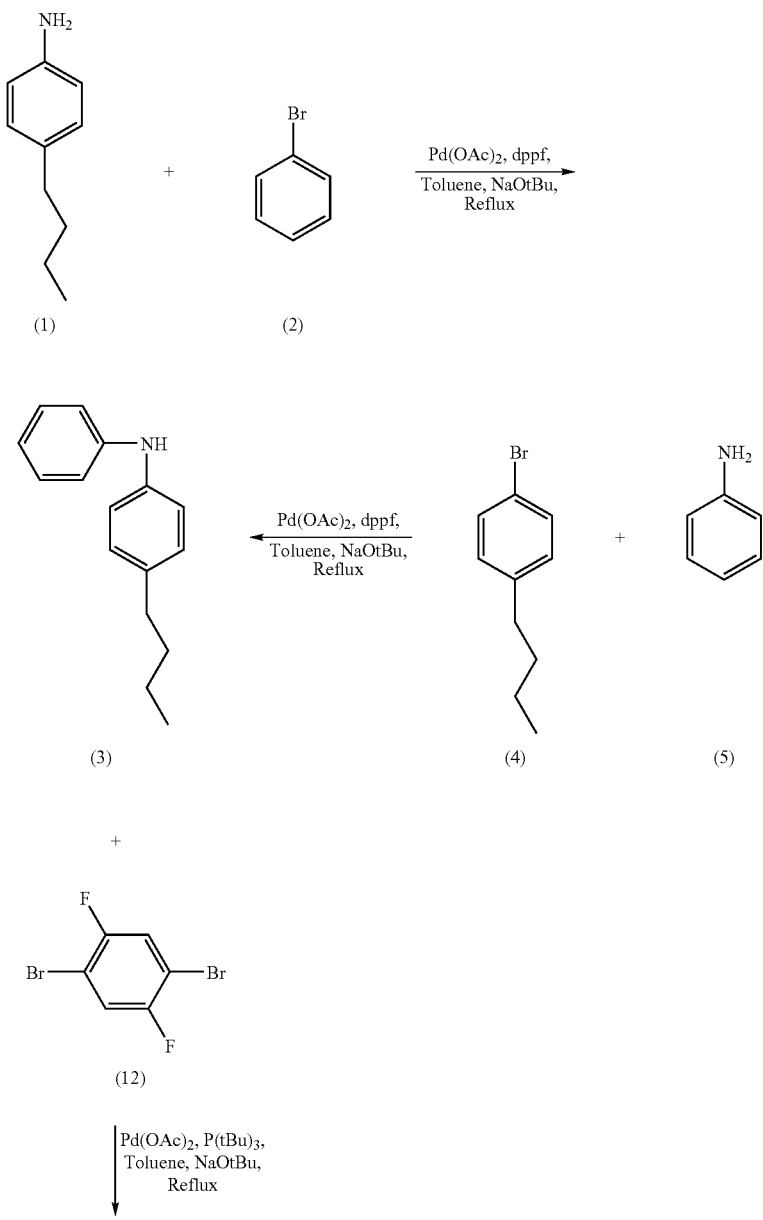

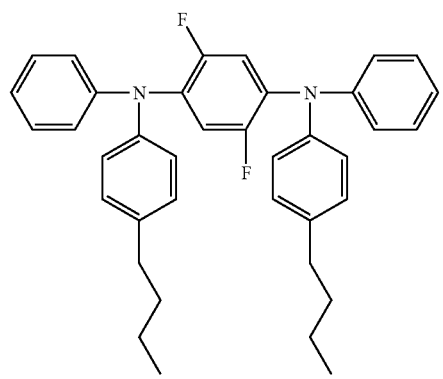

(13)

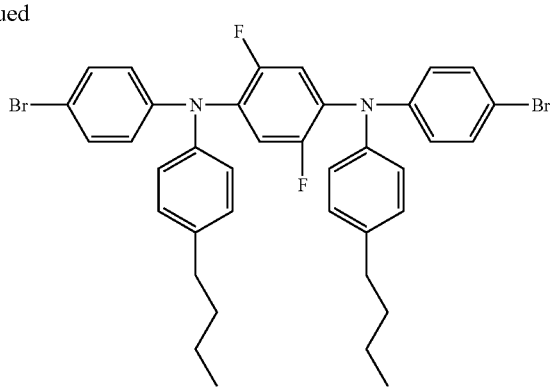

(14)

4.1 N,N'-Diphenyl-N,N'-bis-(4-n-butylphenyl)-2,5-difluorophenylene-1,4-diamine (13)

Procedure as described above, only using N-phenyl-N-(n-butylphenyl)amine (3) (82.75 g, 0.348 mol, 2.0 eq.), 1,4-dibromo-2,5-difluorobenzene (12) (50 g, 0.1839 mol, 1.0 eq.), palladium(II) acetate (0.826 g, 0.0037 mol, 2 mol %), tri-tert-butylphosphine (2.362 g, 0.0110 mol, 6 mol %), sodium tert-butoxide (53.02 g, 0.538 mol, 3.0 eq.) and toluene (500 mL). After reflux for 16 hours, GC-MS indicated incomplete conversion, so a further charge of catalyst and ligand were added, followed by reflux for a further 20 h. GC-MS after this time indicated almost complete reaction.

The reaction mixture was worked-up as described above.

The crude product was then purified by column chromatography (hexanes 100% to 5% diethyl ether in hexanes gradient) to afford the product (13) as a white solid (23.5 g, 23%) at a HPLC purity of 91%. This was recrystallised from acetonitrile several times to afford the product as a white solid at 99.3% GCMS purity (8.36 g). GC-MS showed one peak with a Rt of 22.85 mins and m/z 560.

4.2 N,N'-Bis-(4-bromophenyl)-N,N'-bis-(4-n-butylphenyl)-2,5-difluorophenylene-1,4-diamine (14)

To a 500 mL round-bottomed flask, equipped with mechanical overhead stirrer, low temperature thermometer, nitrogen inlet/exhaust and bubbler was added the precursor compound (13) (8.36 g, 0.0149 mol, 1.0 eq.) and dichloromethane (100 mL). The resulting solution was cooled to −5° C. and N-bromosuccinimide (5.315 g, 0.0299 mol, 2.0 eq.) added portionwise so as to maintain the internal temperature at −5° C. The solution was stirred and slowly allowed to warm to room temperature over 16 hours. GC-MS after this time indicated complete conversion to the desired product.

The solvent was removed in vacuo and the residue resuspended in toluene, causing precipitation of the succinimide by-product, which was removed by filtration. Concentration of the filtrate in vacuo afforded the crude product. Purification was by repeated recrystallisation from acetonitrile. This afforded the main product (14) (7.76 g, 69%) as a white solid at 99.63% HPLC purity.

Example 5

Monomer 5: Alkyl-substituted Repeat Unit
(Substituent on Ar² of Formula I; Boronic Acid and Halide Monomers)

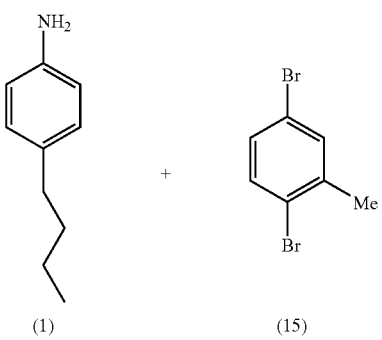

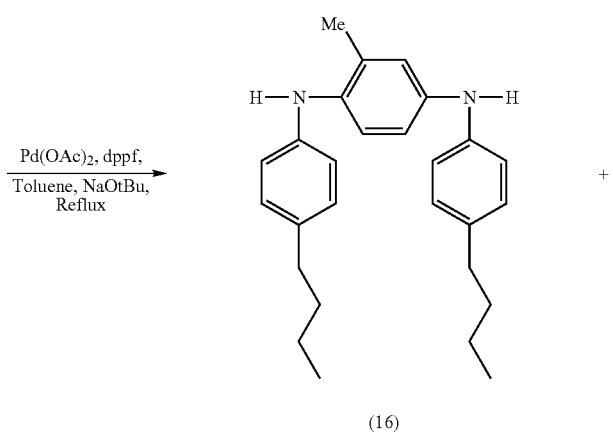

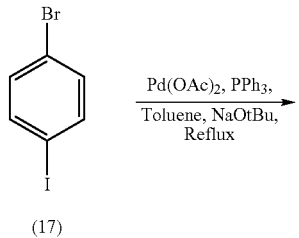

(17)

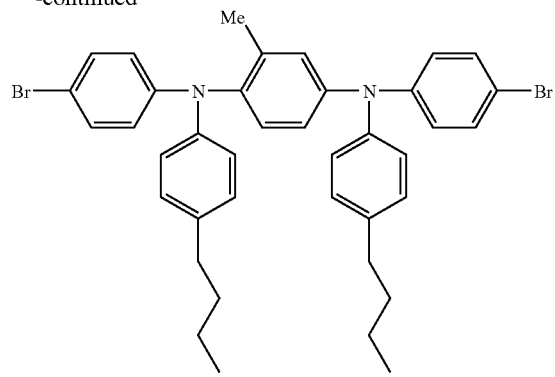

(18)

| n-BuLi, IPPB,
THF, -78° C.

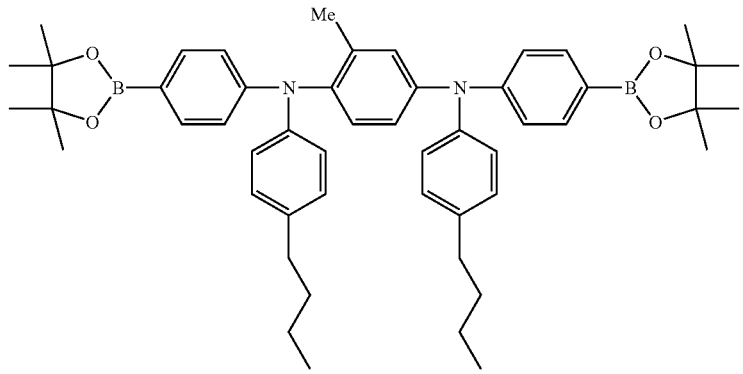

(19)

5.1 N,N'-Bis-(4-n-butylphenyl)-2-methylphenylene-1,4-diamine (16)

To a 2 L 3-neck round-bottomed flask, equipped with mechanical overhead stirrer, nitrogen inlet/exhaust, reflux condenser, internal thermometer was added n-butylaniline (1) (61.2 g, 0.41 mol, 2.05 eq.), 2,5-dibromotoluene (15) (50 g, 0.20 mol, 1.0 eq.) and toluene (1100 mL). The resulting solution was degassed by sparging with nitrogen gas for 1 hour, then palladium(II) acetate (0.45 g, 2.0 mmol, 1 mol %) and 1,1'-diphenylphosphinoferrocene (3.33 g, 6.0 mmol, 3 mol %) added. The resulting solution was stirred for 15 mins under nitrogen then the base, sodium tert-butoxide (57.7 g, 0.60 mol, 3.0 eq.) added. The solution was then heated to reflux for 18 hours and a sample then removed for GCMS. This indicated complete reaction and the mixture was poured into deionised water (1000 mL). The toluene phase was removed and the aqueous extracted with toluene (500 mL). The toluene phases were combined and filtered through silica gel (200 g), collecting 7 L of toluene in total. The resulting filtrates were then concentrated to dryness in vacuo.

Purification of the material was by cold trituration from hexanes. This afforded the product (16) as a red-brown solid (38.9 g, 50%).

5.2 N,N'-Bis-(4-bromophenyl)-N,N'-bis-(4-n-butylphenyl)-2-methylphenylene-1,4-diamine (18)

To a 3 L, 3-neck round-bottomed flask, equipped with overhead mechanical stirrer, reflux condenser, nitrogen inlet/exhaust, etc was added the precursor material (16) (58.3 g, 0.15 mol, 1.0 eq.), 4-bromo-1-iodobenzene (17) (89.59 g, 0.32 mol, 2.1 eq.) and toluene (1500 mL) and the resulting solution degassed by sparging with toluene for 1 hour. After this time, palladium(II) acetate (0.34 g, 1 mol %) and triphenylphosphine (1.19 g, 3 mol %) were added and the solution stirred for 15 mins under nitrogen. The base, sodium tert-butoxide (43.25 g, 0.45 mol, 3.0 eq.) was then added and the solution heated to reflux. TLC after 18 hours indicated the reaction to be complete.

The solution was allowed to cool to room temperature and the mixture poured into deionised water (750 mL) and stirred vigorously for 10 mins. The toluene phase was separated and filtered through silica gel (200 g), collecting a total of 3.5 L of toluene. The filtrates were then concentrated to dryness in vacuo and the products separated using column chromatography (hexanes to 20% dichloromethane in hexanes, gradient). The product was afforded as a waxy solid (40.5 g, 50%) at a HPLC purity of 97.98%. The product (18) was a waxy solid and could not be crystallised so was therefore converted to the diester.

5.3 N,N'-Bis-(4-boronic pinacol ester phenyl)-N,N'-bis-(4-n-butylphenyl)-2-methylphenylene-1,4-diamine (19)

To a 1 L 3-neck flask, equipped with low temperature thermometer, pressure-equalised dropping funnel, mechanical stirrer etc was added the dibromide (18) (26.77 g, 38.4 mmol, 1.0 eq.) and anhydrous THF (150 mL). The resulting solution was cooled to −78° C. and a solution of n-butyl lithium (2.5M in hexanes) (38.4 mL, 96.1 mmol, 2.5 eq.) was added dropwise, maintaining the internal temperature <−65° C. The solution was stirred at −78° C. for 6 hours, then a solution of isopropylpinacolborate (20.02 g, 21.7 mL, 107.6 mmol, 2.8 eq.) in THF (20 mL) was added dropwise, maintaining the internal temperature <−65° C. The reaction was then allowed to warm slowly to room temperature over 16 hours.

The solution was then re-cooled to 0° C. and anhydrous HCl in ether (2M, 61.5 mL, 3.2 eq.) was added and the solution allowed to warm to room temperature over 1 hour. The solution was then concentrated to dryness in vacuo and the product dissolved in toluene (200 mL), causing precipitation of LiBr, which was removed by filtration. The toluene was removed in vacuo and the crude product crystallised form isopropyl alcohol. Four further recrystallisation from isopropyl alcohol/toluene mixtures afforded the product (19), 10.18 g, 38% at a HPLC purity of 99.61%.

Example 6

Monomer 6: Alkyl-substituted Repeat Unit (Substituents on Ar¹ of formula I and in Ortho-position of Ar³ of Formula I)

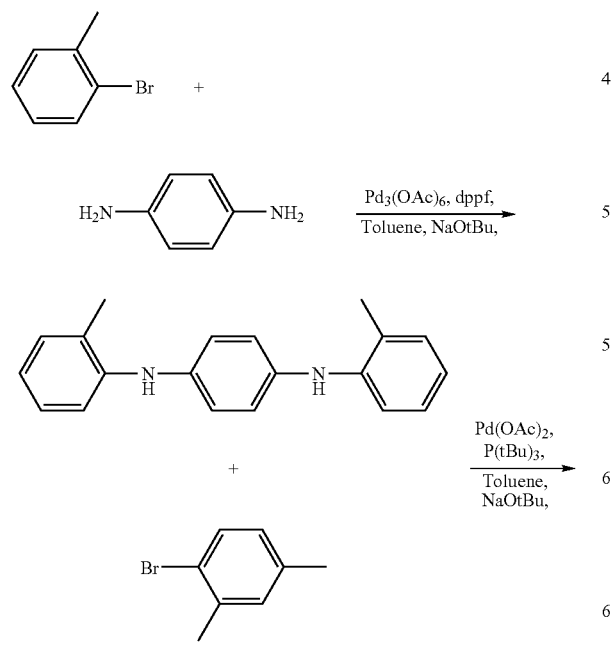

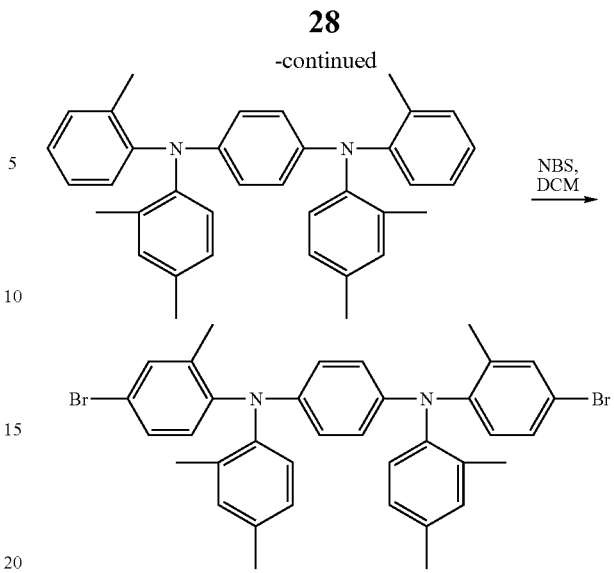

6.1 Preparation of N,N'-Bis-(2,4-dimethylphenyl)-N,N'-di-(o-tolyl)-1,4-phenylenediamine Procedure as described above except using the product from above (28.84 g, 0.10 mol, 1.0 eq.), 4-bromo-m-xylene (46.27 g, 0.25 mol, 2.5 eq.), palladium(II) acetate (2.24 g, 0.1 eq.), dppf (5.52 g, 0.1 eq.), toluene (500 mL) and sodium tert-butoxide (28.80 g, 0.30 mol, 3.0 eq.).

The product was afforded as a brown solid, 12.0 g, 24%.

6.2 Preparation of N,N'-Bis-(2,4-dimethylphenyl)-N,N'-bis-(4-bromo-2-methylphenyl)-1,4-phenylenediamine Procedure as described above except using the product above, N,N'-bis-(2,4-dimethylphenyl)-N,N'-di-(o-tolyl)-1,4-phenylenediamine (12.42 g, 0.025 mol, 1.0 eq.), NBS (4.45 g, 0.05 mol, 2.0 eq.) and dichloromethane (100 mL).

The product was purified by repeated recrystallisation from isopropyl alcohol to afford a white solid (6.14 g, 24% yield) at 99.64% HPLC purity.

Examples 7 & 8

Polymer Examples

Polymers according to the invention were formed by Suzuki polymerisation of the monomers described above according to the method set forth in WO 00/53656. Co-monomers used were as follows:

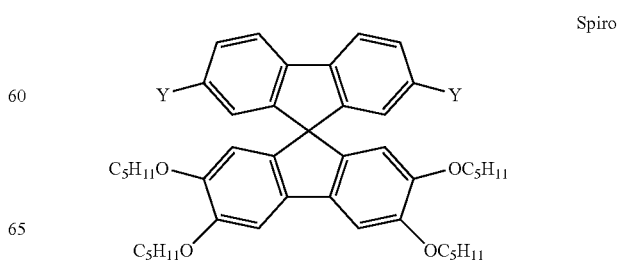

Indeno

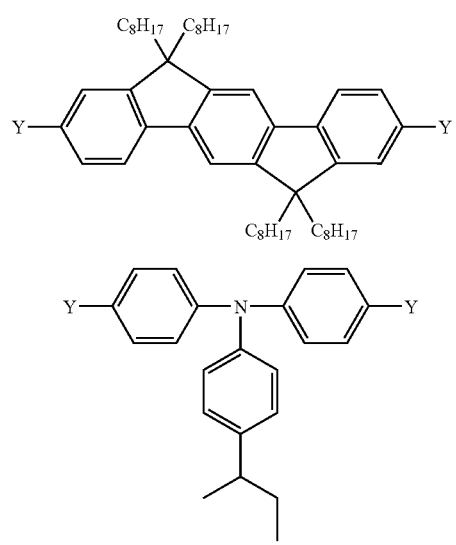

TA1

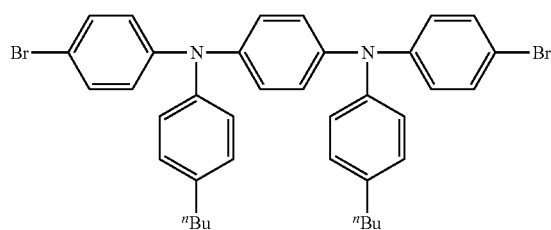

Y = bromine or the ethylene glycol ester of boronic acid

Ratios of monomers used to form the various polymers are described in the tables below.

For each polymer made using a monomer according to the invention, an identical polymer was made except that a comparative monomer C1 according to the state of the art was used in place of the inventive monomer:

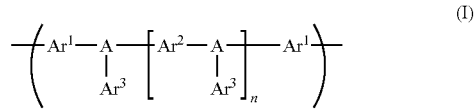

Comparative Monomer C1

Device Examples

Electroluminescent devices 1 and 2 were made using polymers 1 and 2 respectively. The devices were formed by providing a glass substrate carrying an anode of indium tin oxide and onto this (a) depositing by spin-coating a layer of poly(ethylene dioxythiophene)/poly(styrene sulfonate) available from H. C. Starck as Baytron P; (b) depositing by spin-coating from xylene solution a layer of polymer according to the invention and (c) depositing by vacuum evaporation a cathode comprising a first layer of calcium and a second, capping layer of aluminium. The device was sealed using an airtight container available from Saes Getters SpA.

In the table below:

"PL" denotes photoluminescence

"EL" denotes electroluminescence

The suffix "-diBr" denotes a dibromo-monomer

The suffix "-diester" denotes a boronic diester

| Polymer-Example | Composition | PL CIE (x, y) | EL CIE (x, y) |
|---|---|---|---|
| 7 | 50% Spiro-diester<br>30% Spiro-diBr<br>10% TA1-diBr<br>10% Monomer 2 | 0.190, 0.200 | 0.158, 0.141 |
| C7 | 50% Spiro-diester<br>30% Spiro-diBr<br>10% TA1-diBr<br>10% Monomer C1 | 0.197, 0.375 | 0.184, 0.311 |
| 8 | 50% Spiro-diester<br>35% Spiro-diBr<br>15% Monomer 2 | 0.170, 0.190 | 0.158, 0.154 |
| C8 | 50% Spiro-diester<br>35% Spiro-diBr<br>15% Monomer C1 | 0.185, 0.340 | 0.197, 0.351 |

As can be seen from the data, polymers containing substituted repeat units according to the invention are blue-shifted relative to polymers containing the unsubstituted prior art repeat unit. The CIE y-co-ordinate serves as a particularly useful guide to the depth of colour of a polymer. Alkyl substituted polymers are blue shifted relative to corresponding comparative polymers. A very marked blue shift is observed in polymers 7 and 8 (fluorine substituent).

Although the present invention has been described in terms of specific exemplary embodiments, it will be appreciated that various modifications, alterations and/or combinations of features disclosed herein will be apparent to those skilled in the art without departing from the spirit and scope of the invention as set forth in the following claims.

The invention claimed is:

1. An optionally substituted oligomer or polymer comprising a repeat unit of formula (I):

$$\left(Ar^1 - \underset{Ar^3}{\overset{|}{A}} \left[Ar^2 - \underset{Ar^3}{\overset{|}{A}}\right]_n Ar^1\right) \quad (I)$$

wherein n is at least 1; each A is a nitrogen atom or optionally substituted phosphorus atom; each $Ar^1$ is the same or different and independently represents an optionally substituted arylene or heteroarylene; each $Ar^3$ is the same or different and independently represents an optionally substituted aryl or heteroaryl; $Ar^2$ represents an optionally substituted arylene or heteroarylene comprising a linking ring to which the two atoms A are both directly linked; and at least one of $Ar^2$, and/or either or both of $Ar^1$ is substituted with at least one substituent and at least a second repeat unit, wherein the second repeat unit is selected from optionally substituted spirobifluorene, indenofluorene or dihydrophenanthrene.

2. An oligomer or polymer according to claim 1 wherein the substituent on $Ar^1$ or $Ar^2$ is selected from the group consisting of optionally substituted, aliphatic or alicyclic $C_{1-20}$ alkyl; $C_{1-20}$ fluoroalkyl; $C_{1-20}$ alkoxy; halogen; nitro; cyano; sulfone and sulfoxide.

3. An oligomer or polymer according to claim 1, wherein $Ar^2$ carries one or two substituents only.

4. An oligomer or polymer according to claim 1, wherein each $Ar^1$ and $Ar^2$ are phenyl.

5. An oligomer or polymer according to claim 1, wherein $Ar^3$ is optionally substituted phenyl.

6. An oligomer or polymer according to claim 1, wherein the further repeat unit is conjugated to the first repeat unit.

7. An oligomer or polymer according to claim 1, wherein at least one $Ar^3$ is substituted by a substituent selected from the group consisting of optionally substituted, branched, cyclic or linear $C_{1-20}$ alkyl or $C_{1-20}$ alkoxy; $C_{1-20}$ fluoroalkyl and fluorine.

8. A blend comprising the oligomer or polymer according to claim 1, and an organic compound capable of at least one of the functions of hole transport, electron transport and emission.

9. A method of forming an oligomer or polymer comprising the step of oligomerising or polymerising an optionally substituted monomer of formula (II):

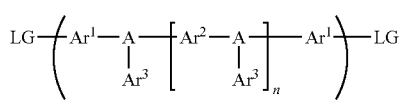

wherein n is at least 1;
each A is a nitrogen atom or optionally substituted phosphorus atom;
each $Ar^1$ is the same or different and independently represents an optionally substituted arylene or heteroarylene;
each $Ar^3$ is the same or different and independently represents an optionally substituted aryl or heteroaryl;
$Ar^2$ represents an optionally substituted arylene or heteroarylene comprising a linking ring to which the two atoms A are both directly linked; and at least one of $Ar^2$, and/or either or both of $Ar^1$ is substituted with at least one substituent
LG is the same or different and represents a leaving group capable of participating in a polycondensation mediated by a metal of variable oxidation state; and at least one of $Ar^2$ and/or either or both of $Ar^1$ is substituted with at least one substituent, and
a second repeat unit which is selected from optionally substituted spirobifluorene, indenofluorene or dihydrophenanthrene,
wherein said oligomerisation or polymerisation is mediated by a metal of variable oxidation state.

10. A method according to claim 9 wherein each LG is independently a halogen or a moiety of formula —O—$SO_2$—Z wherein Z is selected from the group consisting of optionally substituted alkyl and aryl, and the monomer of formula (II) is oligomerised or polymerised in the presence of a nickel complex catalyst.

11. A method according to claim 10 wherein the monomer of formula (II) is oligomerised or polymerised with a second aromatic monomer in the presence of a palladium complex catalyst and a base and
a. each LG is the same or different and comprises a reactive boronic group and the second monomer comprises two reactive groups independently selected from halogen and a moiety of formula —O—$SO_2$—Z wherein Z is selected from the group consisting of optionally substituted alkyl and aryl , or
b. each LG independently comprises a halogen or a moiety of formula —O—$SO_2$—Z wherein Z is selected from the group consisting of optionally substituted alkyl and aryl, and the second monomer comprises two reactive boron groups which are the same or different.

12. A method according to claim 9 wherein one LG is a reactive boron group; the other LG is a halogen or a moiety of formula —O—$SO_2$—Z wherein Z is selected from the group consisting of optionally substituted alkyl and aryl, and the monomer of formula (II) is oligomerised or polymerised in the presence of a palladium complex catalyst and a base.

13. An optical device comprising the oligomer or polymer according to claim 1.

14. An optical device comprising the blend according to claim 8.

15. An optical device according to claim 13 wherein the oligomer or polymer or blend is located in a layer between a first electrode for injection of holes and a second electrode for injection of electrons.

16. An optical device according to claim 13, wherein the optical device is an electroluminescent device.

17. A switching device comprising an oligomer or polymer according to claim 1.

18. A field effect transistor comprising an insulator having a first side and a second side; a gate electrode located on the first side of the insulator; an oligomer or polymer according to claim 1 located on the second side of the insulator; and a drain electrode and a source electrode located on the oligomer or polymer.

19. An integrated circuit comprising a field effect transistor according to claim 18.

20. An optionally substituted oligomer or polymer comprising a repeat unit of formula (I):

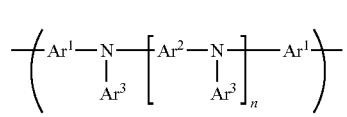

wherein n is at least 1; each A is a nitrogen atom or optionally substituted phosphorus atom; each $Ar^1$ is the same or different and independently represents an optionally substituted arylene or heteroarylene; each $Ar^3$ is the same or different and independently represents an optionally substituted aryl or heteroaryl; $Ar^2$ represents an optionally substituted arylene or heteroarylene comprising a linking ring to which the two atoms A are both directly linked; and at least one of $Ar^2$, and/or either or both of $Ar^1$ is substituted with at least one substituent and wherein the substituent on $Ar^1$ or $Ar^2$ is selected from the group consisting of optionally substituted, aliphatic or alicyclic $C_{1-20}$ fluoroalkyl; halogen; nitro; cyano; sulfone and sulfoxide and
at least a second repeat unit, wherein the second repeat unit is selected from optionally substituted, fluorene, spirobifluorene, indenofluorene or dihydrophenanthrene.

21. The oligomer or polymer according to claim 1 wherein the substituent on $Ar^1$ or $Ar^2$ is selected from the group consisting of optionally substituted, aliphatic or alicyclic $C_{1-20}$ fluoroalkyl; halogen; nitro; cyano; sulfone and sulfoxide.

22. The oligomer or polymer according to claim 1 wherein the substituent on $Ar^1$ or $Ar^2$ is selected from the group consisting of optionally substituted, aliphatic or alicyclic $C_{1-20}$ fluoroalkyl or fluorine.

23. The oligomer or polymer according to claim 20, wherein the second repeat unit is selected from optionally substituted phenyl or dihydrophenanthrene.

24. The oligomer or polymer according to claim 1 wherein the second repeat unit is an optionally substituted spirobifluorene.

25. The oligomer or polymer according to claim 1 wherein the second repeat unit is an optionally substituted indenofluorene.

26. The oligomer or polymer according to claim 1 wherein the second repeat unit is an optionally substituted dihydrophenanthrene.

* * * * *